US007494748B2

(12) United States Patent
Adkisson et al.

(10) Patent No.: US 7,494,748 B2
(45) Date of Patent: Feb. 24, 2009

(54) METHOD FOR CORRECTION OF DEFECTS IN LITHOGRAPHY MASKS

(75) Inventors: James W. Adkisson, Jericho, VT (US); Eric M. Coker, Burlington, VT (US); Christopher K. Magg, Jericho, VT (US); Jed H. Rankin, Richmond, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 10/904,308

(22) Filed: Nov. 3, 2004

(65) Prior Publication Data

US 2006/0093924 A1 May 4, 2006

(51) Int. Cl.
*G03F 1/00* (2006.01)
(52) U.S. Cl. .......................................... 430/5
(58) Field of Classification Search ....................... 430/5
See application file for complete search history.

(56) References Cited

U.S. PATENT DOCUMENTS

| 4,778,693 | A | * | 10/1988 | Drozdowicz et al. | ........ | 427/584 |
|---|---|---|---|---|---|---|
| 5,795,685 | A | | 8/1998 | Liebmann et al. | | |
| 6,159,641 | A | * | 12/2000 | Baum et al. | ..................... | 430/5 |
| 6,258,489 | B1 | * | 7/2001 | Stanton et al. | .................. | 430/5 |
| 6,566,019 | B2 | | 5/2003 | Kling et al. | | |
| 6,613,500 | B1 | | 9/2003 | Phan et al. | | |
| 6,756,164 | B2 | * | 6/2004 | Franke et al. | ................... | 430/5 |
| 7,261,982 | B2 | * | 8/2007 | Fondeur et al. | ................. | 430/5 |
| 2003/0044059 | A1 | * | 3/2003 | Chang et al. | ................. | 382/149 |
| 2004/0086789 | A1 | * | 5/2004 | Hasegawa et al. | .............. | 430/5 |
| 2004/0146787 | A1 | * | 7/2004 | Ramstein | ....................... | 430/5 |
| 2004/0265704 | A1 | * | 12/2004 | Chang et al. | .................. | 430/5 |
| 2005/0147895 | A1 | * | 7/2005 | Chang et al. | .................. | 430/5 |

FOREIGN PATENT DOCUMENTS

JP          3270009 A          12/1991

* cited by examiner

*Primary Examiner*—Mark F Huff
*Assistant Examiner*—Stewart A Fraser
(74) *Attorney, Agent, or Firm*—Cantor Colburn LLP; Richard Kotulak

(57) ABSTRACT

A method for correction of defects in lithography masks includes determining the existence of mask defects on an original mask, and identifying a stitchable zone around each of the mask defects found on the original mask. Each of the identified stitchable zones on the original mask is blocked out such that circuitry within the stitchable zones is not printed out during exposure of the original mask. A repair mask is formed, the repair mask including corrected circuit patterns from each of the identified stitchable zones.

7 Claims, 4 Drawing Sheets

METHOD FOR CORRECTION OF DEFECTS IN LITHOGRAPHY MASKS

BACKGROUND

The present invention relates generally to optical lithography techniques used in semiconductor device processing and, more particularly, to a method for correction of defects in lithography masks.

Semiconductor fabrication techniques often utilize a mask or reticle in a conventional lithographic system to project an image onto a semiconductor wafer, wherein radiation is provided through (or reflected off) the mask/reticle, and passed through a focusing optical system to form the image (e.g., an integrated circuit pattern). The semiconductor wafer is positioned to receive the radiation transmitted through (or reflected off) the mask/reticle such that the image formed on the wafer corresponds to the pattern on the mask/reticle. The radiation source may be light, such as ultraviolet light, vacuum ultraviolet (VUV) light, extreme ultraviolet light (EUV) and deep ultraviolet light (DUV). In addition, the radiation may also be x-ray radiation, e-beam radiation, etc. Generally, the formed image is utilized on the wafer in order to pattern a layer of material, such as a photoresist material. The photoresist material, in turn, may be utilized to define doping regions, deposition regions, etching regions, or other structures associated with the manufacture of integrated circuits (ICs).

Existing photolithography masks (e.g., leading edge masks) are fabricated at a significant cost and lead-time. One of the most significant cost factors in mask production is the desire for producing completely defect free masks, since a non-repairable defect (or a requirement to implement even a slight design change) may result in the need to create an entirely new mask. In addition to the added direct cost, fabricating a new mask can delay product qualification, thus resulting in even greater economic loss.

Unfortunately, producing a mask without printable defects is one of the difficult challenges in mask manufacturing. Although meeting critical dimension (CD) control and image placement accuracies are also difficult challenges, producing a mask with no printable defects arguably remains the most difficult due to factors such as smaller feature spacing, smaller defect criteria and a need for minimal transmission loss in a repaired area, and increases in the complexity of optical proximity correction (OPC). Such stringent requirements are driven by the necessity of the low-k1 factor of leading-edge lithography. With the continued extension of existing 248 and 193 nm wavelengths, as well as the delay of 157 nm lithography, low-k1 lithography will continue as the dominant lithography technique for the foreseeable future. As a direct result, the use of both OPC and embedded and alternating aperture phase shift mask (PSM) usage will increase for quite some time. With these requirements comes a stronger need for mask repair that is both robust and cost-effective.

SUMMARY

The foregoing discussed drawbacks and deficiencies of the prior art are overcome or alleviated by a method for correction of defects in lithography masks. In an exemplary embodiment, the method includes determining the existence of mask defects on an original mask, and identifying a stitchable zone around each of the mask defects found on the original mask. Each of the identified stitchable zones on the original mask is blocked out such that circuitry within the stitchable zones is not printed out during exposure of the original mask. A repair mask is formed, the repair mask including corrected circuit patterns from each of the identified stitchable zones.

In another embodiment, a method for correction of defects in lithography masks includes determining the existence of mask defects on a plurality of original masks, and identifying a stitchable zone around each of the mask defects found on each of the plurality of original masks. Each of the identified stitchable zones on each of the plurality of original masks is blocked out such that circuitry within the stitchable zones is not printed out during exposure of the plurality of original masks. A repair mask is formed, the repair mask including corrected circuit patterns from each of the identified stitchable zones on each of the plurality of original masks.

In still another embodiment, an apparatus for correction of defects in lithography masks includes a repair mask, the repair mask including corrected circuit patterns from each of a plurality of identified stitchable zones surrounding one or more blocked out mask defects on an original mask.

BRIEF DESCRIPTION OF THE DRAWINGS

Referring to the exemplary drawings wherein like elements are numbered alike in the several Figures.

DETAILED DESCRIPTION

Disclosed herein is a method and apparatus for correction of defects in lithography masks. Briefly stated, the method is used to identify one or more "stitchable" areas around defects or other areas on a mask (or masks) needing a correction, followed by creating a corrected image of each identified area onto a single repair mask. This may be accomplished, in one embodiment, by dedicating a single repair mask for each corrected defect on a single mask, wherein the corrections are located on a corresponding region of the repair mask. In this manner, a single exposure step may be in conjunction with the repair mask to form the corrected patterns. Alternatively, a single repair mask may include multiple corrected regions regardless of which mask(s) on which the defects are present. Thus, one repair mask contains all of the repairs for defects on multiple original masks.

The present invention embodiments are advantageous with respect to previous approaches that create an entirely new mask having several more features and subject to additional defects. Moreover, blanking out a selected area and implementing a double exposure (as opposed to attempting to reprint in the same area) is advantageous, in that the blank may be realized by a simple layer of material without having to reproduce the substrate quality, including phase shift layers where needed. Attempting to reprint in the same area of the mask is not desirable because of the difficulties in trying to accurately reconstruct the metal stack, particularly on a phase shift mask or reflective mask.

Figure 1:
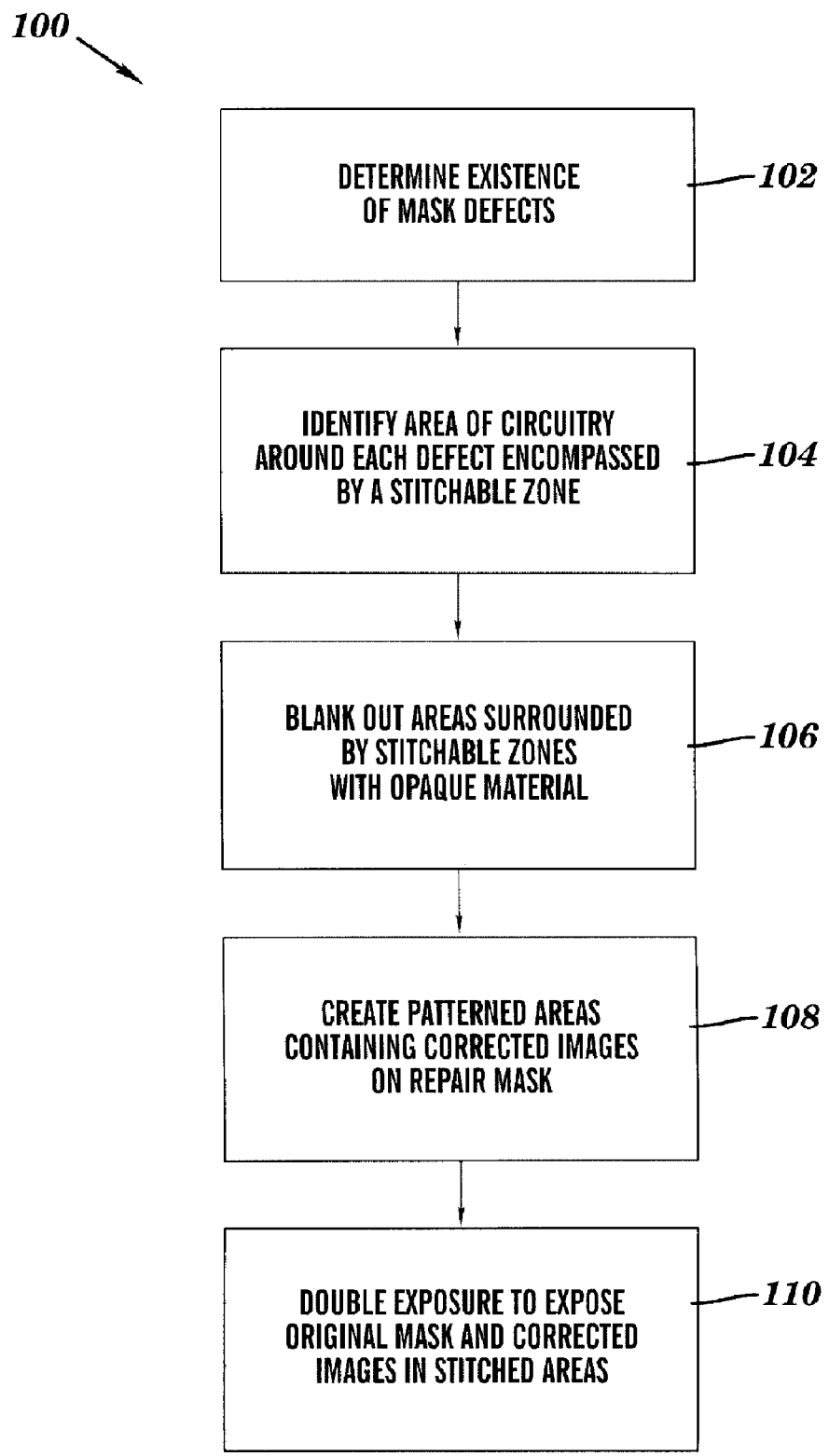
FIG. 1 is a process flow diagram illustrating a method and layout for correction of defects in lithography masks, in accordance with an embodiment of the invention.

Referring initially to FIG. 1, there is shown a process flow diagram illustrating a method 100 and layout for correction of defects in lithography masks, in accordance with an embodiment of the invention. As shown in block 102, the existence of mask defects within a single mask is first determined. Then, as shown in block 104, for each defect, an area is identified around the defect that is bordered by a "stitchable" zone wide enough to align a resist exposure on the mask (e.g., on the order of about 5 microns (μm)). In an exemplary embodiment, the area surrounded by a stitchable zone is sought to be a minimum area (e.g., about 1 square micron). As described herein, a stitchable zone is considered an area that includes one or more of the following features therein: blank areas, areas containing fill, areas containing a feature, such as a wire, that crosses the potential stitchable zone with a thickness equal to the minimum required design thickness plus the potential exposure registration offset. For example, border cells of design books and fill (dummy) areas are considered likely to provide stitchable areas. Moreover, a stitchable area can cut through fill shapes.

As shown in block 106, the areas encompassed within the stitchable zones are then blanked out with an opaque material, which may be accomplished by one of a number of acceptable methods. In one embodiment, a region of circuitry to be replaced (out to the stitchable zone) is blanked by a direct metal deposition. Alternatively, all of the mask area (with the exception of the areas surrounded by the stitchable zones) is blocked out with photoresist. Then, a metal such as chrome is deposited (e.g., sputtered) over the entire mask area. However, it will be appreciated that other actinic opaque materials other than chrome may also be used. Furthermore, phase shifting or partially transmitting films may also be deposited.

When the resist (and opaque thereon) is subsequently removed by a process known as "photoresist lift-off," only the opaque deposited inside the stitchable zones remains. Other known resist/etch combinations, such as utilizing an additional negative resist layer to protect the blocked region during liftoff, may also be used in this regard. Still another embodiment for blanking can include forming/spinning a dielectric layer such as $SiO_2$, SiLK, polyamide, etc. onto the mask, followed by a damascene additive process used to position metal over the stitchable region. The blanking process may also be designed to allow a dielectric layer to remain on the mask where mask pattern can be transferred to wafer through the dielectric layer.

Proceeding to block 108, patterned areas containing the corrected images are created on a separate repair mask. In one embodiment, the repair mask may be used for each defect discovered on a single mask. In this case, not only does the repair mask contain the corrected regions for each identified stitchable area on the opaqued original mask, but also each of those regions is located in a corresponding location on the repair mask. Thus, as shown in block 110, a double exposure pattern may be used to first expose the original mask, followed by a second exposure using the repair mask to simultaneously expose the corrected images in the stitched areas. Because the corrected areas created on the repair mask correspond to the actual locations of the defective areas on the original mask, repair regions for defects found in other masks would be created on a separate repair mask. In other words, each repair mask having multiple corrections thereon will correspond to one original mask, due to the tradeoff of being able to transfer all of the corrected patterns with a single additional exposure step.

However, in an alternative embodiment of method 100, a single repair mask could include all corrections for all discovered defects for a device manufacturing process, regardless of the device level itself (i.e., for defects on multiple masks). This would allow for conserving repair mask real estate, in that the correction regions may be efficiently located on the repair mask. The tradeoff in this regard is that for multiple defects on a particular level, a separate exposure step would be used for each defect, since the repair mask would have to be realigned for each corrective patterning exposure. In this case, each correction zone will preferably include a border of opaque material, which may be on the order of 3 mm in thickness, to allow for optical isolation in the lithography exposure tool.

Regardless of the embodiment implemented, a mask containing multiple correction zones for associated mask defects is a desirable alternative to fabricating an entirely new mask or masks. In view of the above described approach, device levels may be designed with stitchable zones as part of the design rules. For wiring levels, this would result in having wire thickness equal to a minimum design thickness plus potential registration offset in a double exposure. This could be accomplished in one aspect by simply requiring thicker wires at intervals on a coarse grid. Alternatively, areas may be sought that are nearly stitchable, except for a minimum of wire(s) that are cross-stitchable areas, and making these wide enough for a length that will accommodate stitching.

Figure 2:
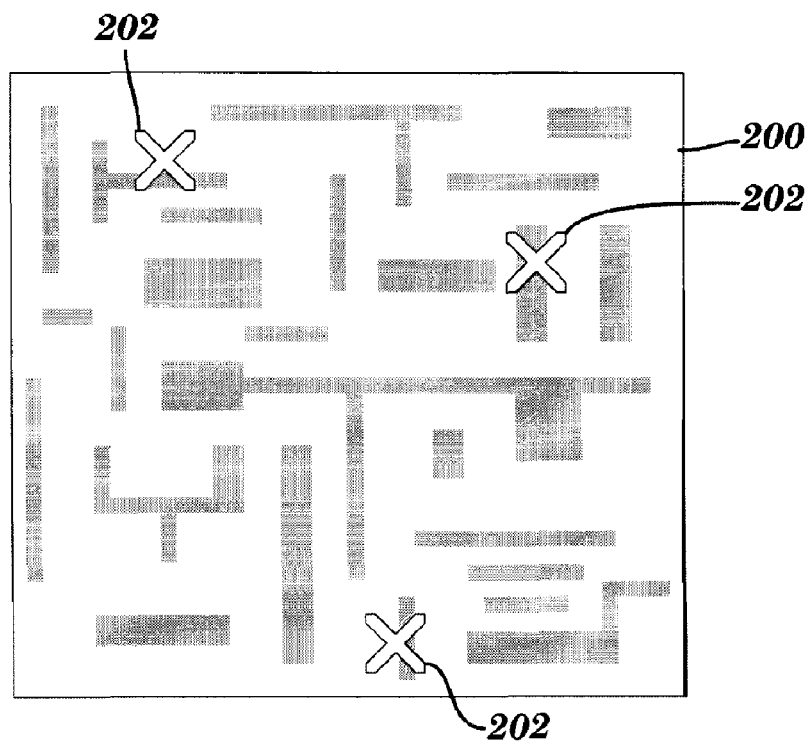
FIG. 2 is a plan view of a leading edge mask having an identified defect thereon.
Figure 3:
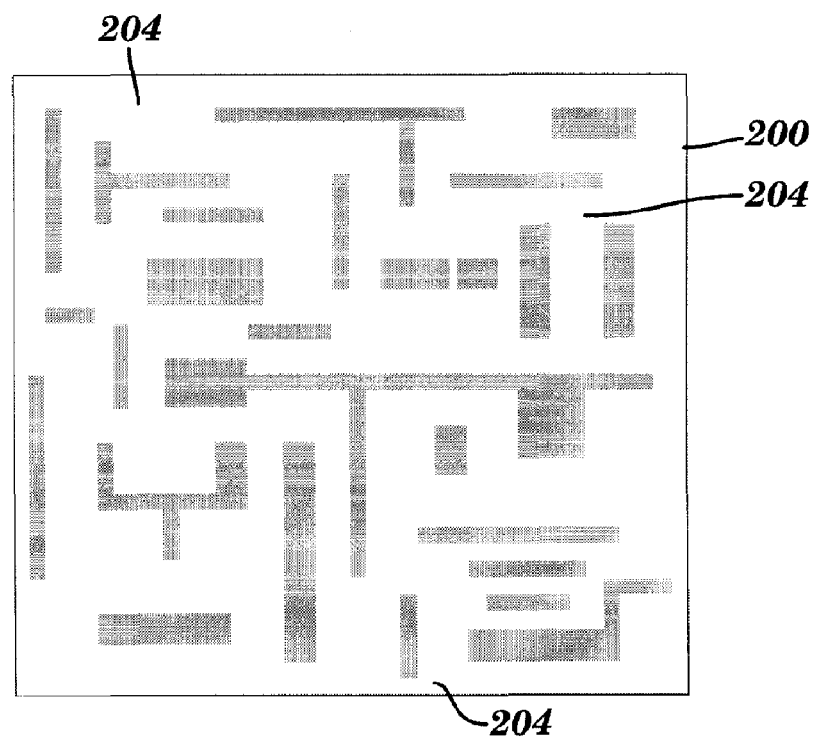
FIG. 3 illustrates an identified area of circuitry surrounding the identified defect that is bordered by a stitchable zone.
Figure 4:
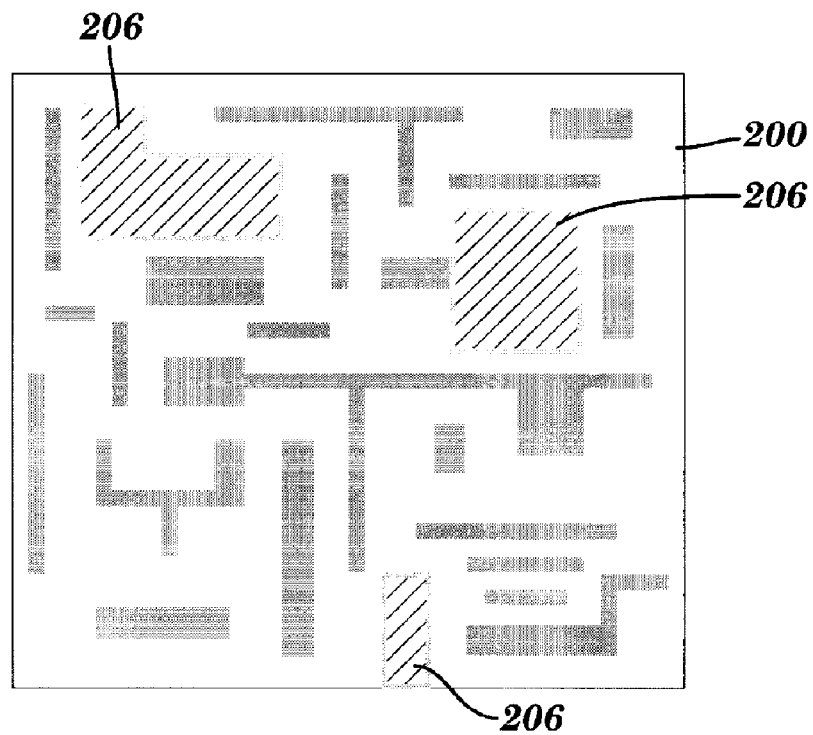
FIG. 4 illustrates the blanking out of the stitchable zone with an opaque material.
Figure 5:
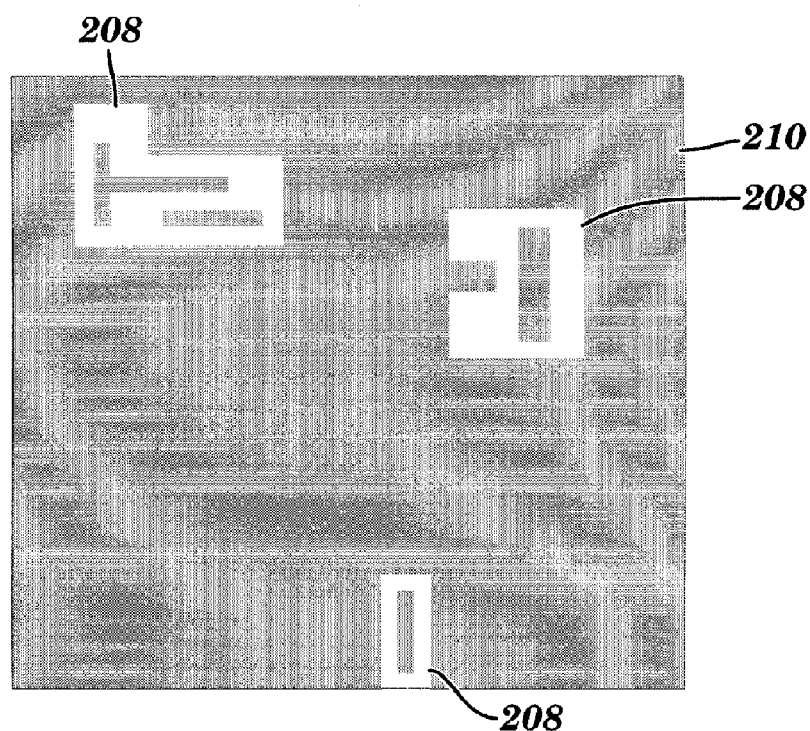
FIG. 5 illustrates a plurality of corrected areas on a repair mask positioned in accordance with a corresponding region on a single original mask.

FIGS. 2 through 6 illustrate various plan views of the exemplary processing steps outlined above. As shown in FIG. 2, an original lithography mask 200 is discovered to have a plurality of defective circuit features therein, specifically identified by X's 202. In accordance with block 104 described above, an area 204 of circuitry is identified around each defect that is bordered by a stitchable zone, as shown in FIG. 3. The blanking of the areas surrounded by the stitchable zones with an opaque material 206 is shown in FIG. 4. Then, as shown in FIG. 5, the corrected circuit patterns 208 are created on a repair mask 210.

Figure 6:
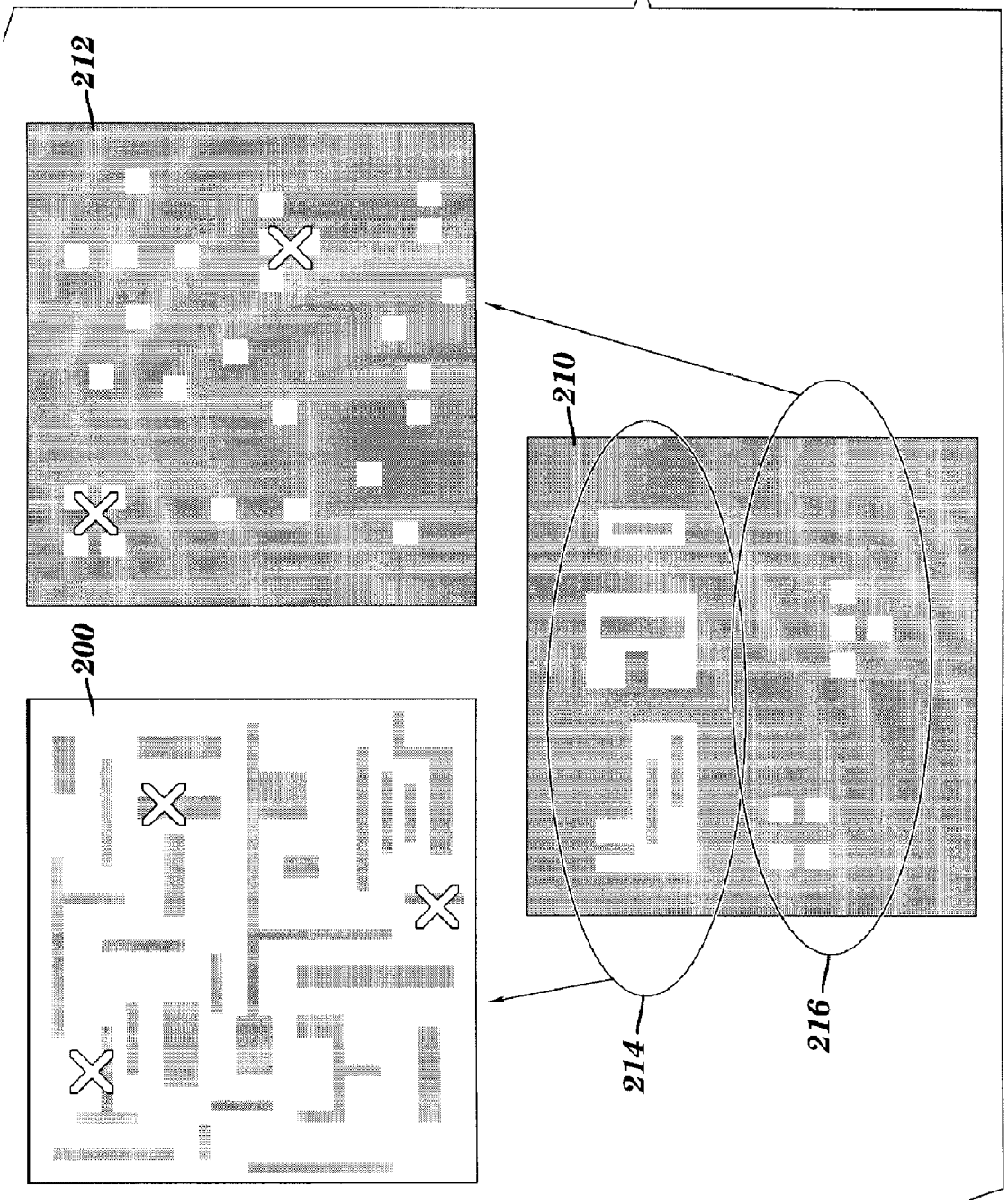
FIG. 6 is an alternative embodiment of FIG. 5, in which the repair mask includes corrected areas from a plurality of individual original masks.

As indicated above, in one embodiment, the repair mask 210 may include corrected patterns from a single original mask. In this case, the corrected patterns may be located in regions corresponding to the defective locations on the original mask, as shown in the example of FIG. 5. On the other hand, FIG. 6 illustrates an alternative embodiment of the repair mask 210, in which the corrected patterns may originate from more than one original mask, and thus the placement of the corrected patters may be carried out in an efficient manner on the repair mask 210. More specifically, FIG. 6 illustrates the first original mask 200 (and associated defects) of FIG. 2, in addition to a second original mask 212 having its own set of defects. In this embodiment, the repair mask 210 includes the repair circuitry from the first original mask 200 in a first region 214 thereon, as well as the repair circuitry from the second original mask 212 in a second region 216 thereon.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for correction of defects in lithography masks, the method comprising:

determining the existence of mask defects on an original mask;

identifying a stitchable zone around each of said mask defects found on said original mask;

blocking out each of said identified stitchable zones on said original mask such that circuitry within said stitchable zones is not printed out during exposure of said original mask, wherein said blocking out further comprises forming a dielectric layer over said original mask, followed by damascene formation of an opaque material over each of said identified stitchable zones;

forming a repair mask, said repair mask including corrected circuit patterns from each of said identified stitchable zones, wherein said corrected circuit patterns from said original mask are formed at corresponding locations on said repair mask;

implementing a first exposure step using said original mask; and implementing a second exposure step using said repair mask, wherein said second exposure step results in simultaneous correction of circuit patterns in each of said identified stitchable zones.

2. A method for correction of defects in lithography masks, the method comprising:

determining the existence of mask defects on a plurality of original masks;

identifying a stitchable zone around each of said mask defects found on each of said plurality of original masks;

blocking out each of said identified stitchable zones on each of said plurality of original masks such that circuitry within said stitchable zones is not printed out during exposure of said plurality of original masks;

forming a single repair mask, said single repair mask including corrected circuit patterns from each of said identified stitchable zones on each of said plurality of original masks, wherein said corrected circuit patterns from each of said plurality of original masks are separated from one another on said single repair mask by an opaque border;

implementing a first exposure step using one of said plurality of original masks; and implementing a subsequent exposure step, using said single repair mask, for each corrected circuit pattern corresponding to said one of said plurality of original masks.

3. The method of claim 2, wherein said blocking out further comprises forming an opaque material over each of said identified stitchable zones using direct material deposition.

4. The method of claim 2, wherein said blocking out further comprises forming an opaque material over each of said identified stitchable zones using a patterned, blanket material deposition.

5. The method of claim 2, wherein said blocking out further comprises forming an insulating layer over said original mask, followed by damascene formation of an opaque material over each of said identified stitchable zones.

6. The method of claim 2, wherein said stitchable zone is an area containing a feature that crosses said stitchable zone and having a thickness at least equal to a minimum design thickness plus a potential exposure registration offset.

7. The method of claim 6, wherein said stitchable zone has a width of at least 5 microns.

* * * * *